United States Patent
Van Berkel et al.

(10) Patent No.: US 7,560,938 B2
(45) Date of Patent: Jul. 14, 2009

(54) OBJECT SENSING

(75) Inventors: Cornelis Van Berkel, Hove (GB); Asher J. Hoskins, Crawley (GB); David S. George, Horsted Keynes (GB)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 10/555,847

(22) PCT Filed: Apr. 28, 2004

(86) PCT No.: PCT/IB2004/001426

§ 371 (c)(1),
(2), (4) Date: Nov. 20, 2006

(87) PCT Pub. No.: WO2004/099964

PCT Pub. Date: Nov. 18, 2004

(65) Prior Publication Data

US 2007/0052428 A1 Mar. 8, 2007

(30) Foreign Application Priority Data

May 7, 2003 (GB) ................................. 0310409.8

(51) Int. Cl.
*G01R 27/26* (2006.01)

(52) U.S. Cl. ...................... 324/662; 324/687; 324/663

(58) Field of Classification Search ................. 324/662, 324/658, 660, 686, 690, 663; 382/124
See application file for complete search history.

(56) References Cited

U.S. PATENT DOCUMENTS

| | | | | |
|---|---|---|---|---|
| 5,793,305 | A | * | 8/1998 | Turner et al. ............. 340/10.34 |
| 6,025,726 | A | * | 2/2000 | Gershenfeld et al. ........ 324/671 |
| 6,437,583 | B1 | * | 8/2002 | Tartagni et al. ............. 324/687 |
| 6,462,563 | B1 | * | 10/2002 | Kawahara et al. ........... 324/690 |
| 6,483,931 | B2 | * | 11/2002 | Kalnitsky et al. ........... 382/124 |
| 6,512,381 | B2 | * | 1/2003 | Kramer ...................... 324/658 |
| 6,593,757 | B2 | * | 7/2003 | Nakayama et al. .......... 324/686 |
| 6,714,666 | B1 | * | 3/2004 | Morimura et al. ........... 382/124 |
| 6,960,790 | B2 | * | 11/2005 | Miyai et al. ................... 257/77 |
| 2005/0253598 | A1 | * | 11/2005 | Kawahata ................... 324/671 |

* cited by examiner

*Primary Examiner*—Timothy J. Dole
*Assistant Examiner*—Thomas F. Valone
(74) *Attorney, Agent, or Firm*—Larry Liberchuk

(57) ABSTRACT

An electric field object sensing system uses a charge pumping circuit to provide a voltage over a capacitor that varies dependent upon the capacitive coupling between a transmitter electrode and a receiver electrode. The output of the charge pump is preferably fed to a high impedance read-out means, such as an analog-digital converter (ADC). The system is preferably implemented in CMOS and integrated in control circuits of electronic products.

13 Claims, 7 Drawing Sheets

OBJECT SENSING

The present invention relates to object sensing using electric field sensing. Electric field sensing is also known as quasi-electrostatic sensing, and may be termed cross capacitive sensing. The present invention is particularly suited to, but not limited to, using object sensing to provide a user interface input.

One sensing technology used for object sensing is capacitive sensing. A different sensing technology used for object sensing is electric field sensing, also known as quasi-electrostatic sensing, and which may be termed cross capacitive sensing.

In its very simplest form, capacitive sensing uses just one electrode and a measurement is made of the load capacitance of that electrode. This load capacitance is determined by the sum of all the capacitances between the electrode and all the grounded objects around the electrode. This is what is done in proximity sensing.

Electric field sensing, which may be termed cross capacitance sensing, uses plural electrodes, and effectively measures the specific capacitance between two electrodes. An electrode to which electric field generating apparatus is connected may be considered to be an electric field sensing transmission electrode (or transmitter electrode), and an electrode to which measuring apparatus is connected may be considered to be an electric field sensing reception electrode (or receiver electrode). The transmitter electrode is excited by application of an alternating voltage. A displacement current is thereby induced in the receiver electrode due to capacitive coupling between the electrodes (i.e. effect of electric field lines). If an object is placed near the electrodes (i.e. in the field lines) some of the field lines are terminated by the object and the capacitive current decreases.

In known object sensing systems using electric field sensing, the presence of the object is sensed by monitoring the capacitive displacement current or changes therein. For example, U.S. Pat. No. 6,025,726 discloses use of an electric field sensing arrangement as, inter-alia, a user input device for computer and other applications. The electric field sensing arrangement senses the position of a user's finger(s), hand or whole body, depending on the intended application. WO-02/103621 discloses a two-phase charge accumulation sensing circuit for monitoring the capacitive current in object sensing systems using electric field sensing. This sensing circuit may be integrated in a display.

In the different field of capacitive sensing, DE 1,992,7358 discloses the use of an integrated circuit using CMOS technology to provide a single chip capacitive sensor. Also, again in the different field of capacitive sensing, U.S. Pat. No. 6,259,804 discloses the use of analogue to digital conversion (ADC) to process signals from an array of capacitive sensors that rely on touch for operation.

The present inventors have realised that in known electric field sensing arrangements there is a reliance on measuring the capacitive displacement current or changes therein and that this requires accurate measurements provided by complex circuitry. The present inventors have realised that this requirement is increased due to the basic method employed in all the various known electric field object sensing systems which is to measure the capacitive displacement current or changes therein during its build up after the capacitors have been grounded.

In a first aspect, the present invention provides an electric field object sensing system (this may also be referred to as a cross capacitance object sensing system) comprising: a transmitter electrode; a receiver electrode; a charge pumping or switching circuit coupled to the receiver electrode; an alternating voltage source coupled directly or indirectly to the transmitter electrode and the charge pumping/switching circuit; and an output connection coupled to the receiver electrode. The charge pumping/switching circuit is arranged to switch so as to perform charge pumping according to the common cycle of alternating voltages applied from the alternating voltage source to the transmitter electrode and the charge pumping/switching circuit. The charge pumping circuit comprises a capacitor arranged such that a voltage developed across the capacitor saturates at a level dependent upon the capacitance between the transmitter electrode and the receiver electrode. The output connection is arranged to deliver the saturated voltage as an output that varies when an object is placed or moved between or the transmitter electrode and the receiver electrode or in the vicinity of the transmitter electrode and the receiver electrode.

The system preferably further comprises a high impedance read-out means coupled to the output connection. Preferred forms of the high impedance read-out means include an analogue to digital converter or a comparator.

The system, or at least some or all of the circuitry parts, e.g. not necessarily, say, the electrodes, may advantageously be implemented in CMOS. Furthermore, the system, or at least some or all of the circuitry parts, e.g. not necessarily, say, the electrodes, especially when implemented in CMOS, may conveniently be integrated in a control circuit of an electronic product.

In a further aspect, the present invention provides a method of providing an output from a receiver electrode of an electric field object sensing system (which may also be referred to as a cross capacitance object sensing system), the method comprising: providing a first alternating voltage to a transmitter electrode; providing a second alternating voltage of the same phase as the first alternating voltage to a charge pumping/switching circuit coupled to the receiver electrode; performing charge pumping/switching, using the charge pumping/switching circuit, according to the cycle of the alternating voltages, to provide a voltage over a capacitor of the charge pumping/switching circuit that increases dependent upon the capacitive coupling between the transmitter electrode and the receiver electrode; allowing the voltage over the capacitor of the switching circuit to saturate; and using the saturated voltage as an output that varies when an object is placed or moved between or the transmitter electrode and the receiver electrode or in the vicinity of the transmitter electrode and the receiver electrode.

The method preferably further comprises feeding the output into a high impedance read-out means. Preferred forms of the high impedance read-out means include an analogue to digital converter or a comparator.

The first alternating voltage may be the same as the second alternating voltage. Another possibility is for the first alternating voltage to be provided by feeding the second alternating voltage to the transmitter electrode via a resonant filter or other types of filter or amplifier.

In other aspects, a switching circuit or other appropriate arrangement is used to carry out a charge pump operation or other process to provide a process of saturating a capacitor or other charge storing device at a voltage or charge level dependent on the capacitance between a transmitter electrode and a receiver electrode, this capacitance changing when an object is placed or moved between or in the vicinity of the transmitter electrode and the receiver electrode.

The switching circuit or other arrangement may be arranged to switch the alternating voltage at respective sides of a capacitor to either the receiver electrode or an earth connection. The switches operate in tandem in response to the polarity of the alternating voltage such that when one side of the capacitor is switched to the receiver electrode the other side of the capacitor is switched to the receiver electrode, and vice-versa. This switching is preferably performed by two respective switches or arrangements, possibly inter-related, that function such that overall they perform such switching.

Thus, some or all of the aspects mentioned above employ a continuous pulse wave train to drive the transmitter electrode. Also, in effect, some or all of the aspects mentioned above provide an output by measuring a quasi steady state voltage level, for example by inputting the quasi steady state voltage level into a high impedance device such as an analogue to digital converter or a comparator.

The above aspects allow for simple processing electronics to be used to process the output signals provided, thus allowing CMOS technology to be used thereby improving the potential for electric field sensing arrangements to be integrated into semiconductor products, such as control circuits for electronic products.

Embodiments of the present invention will now be described, by way of example, with reference to the accompanying drawings, in which.

Figure 1:
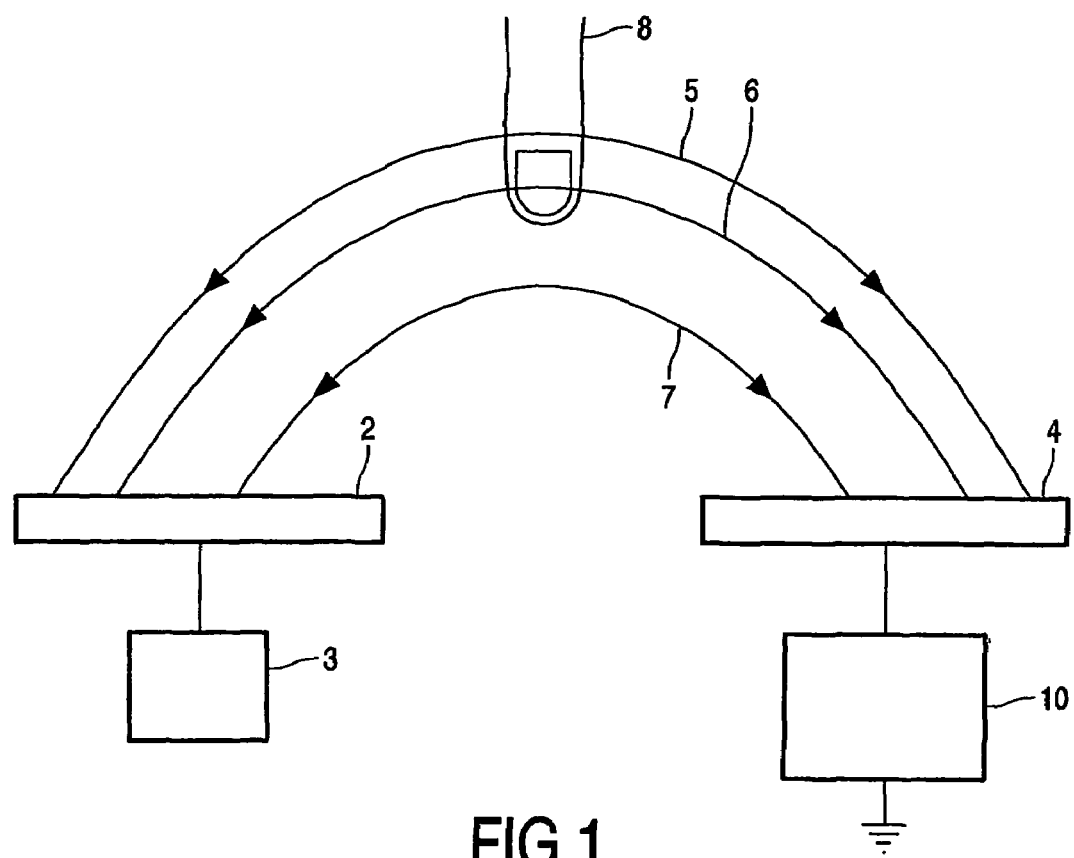
FIG. 1 is a schematic illustration (not to scale) of an electric field object sensing system.

FIG. 1 is a schematic illustration (not to scale) of an electric field (also known as cross capacitance) object sensing system 1 according to the first embodiment comprising a transmitter electrode 2, an alternating voltage source 3, a receiver electrode 4, and sensing circuitry 10.

The alternating voltage source 3 is connected to the transmitter electrode 2. The current sensing circuitry 10 is connected to the receiver electrode 4.

In operation, when an alternating voltage is applied to the transmitter electrode 2, electric field lines are generated, of which exemplary electric field lines 5, 6, 7 pass through the receiver electrode 4. The field lines 5, 6, 7 induce a small alternating current at the receiver electrode 4.

When an object 8, e.g. a finger, is placed in the vicinity of the two electrodes 2, 4, the object 8 in effect terminates those field lines (in the situation shown in FIG. 1, field lines 5 and 6) that would otherwise pass through the space occupied by the object 8, thus reducing the cross-capacitive effect between the two electrodes 2, 4 e.g. reducing the current flowing from the receiver electrode 4. In conventional electric field object sensing systems the induced alternating current would be measured using a current sensing circuit, such a current sensing circuit using a tapped off signal from the alternating voltage to tie in with the phase of the electric field induced current.

Thus the current level measured by the current sensing circuit would be used as a measure of the presence of an object in the vicinity of the two electrodes 2, 4.

However, in the electric field object sensing system 1 of this embodiment, the sensing circuitry 10 is instead arranged to detect the effect of the object 8 being in the electric field lines 5, 6 in a way that differs from conventional current measurement of the induced current as such, as will be described in more detail below.

Figure 2:
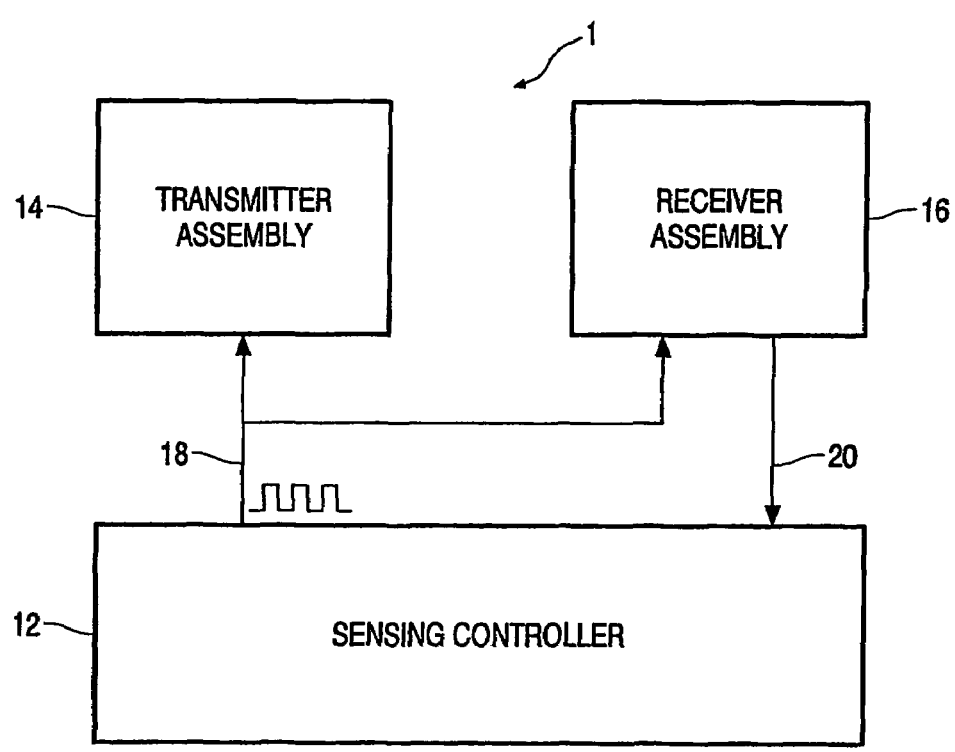
FIG. 2 is a block diagram showing further details of the electric field object sensing system of FIG. 1.

FIG. 2 is a block diagram showing further details of the electric field object sensing system 1 of this embodiment. The electric field object sensing system 1 comprises a sensing controller 12, a transmitter assembly 14, and a receiver assembly 16. In order to compare with the simplified form shown in FIG. 1, note that the alternating voltage source 3 of FIG. 1 forms part of the sensing controller 12; the transmitter electrode 2 forms part of the transmitter assembly 14; the receiver electrode 4 forms part of the receiver assembly 16; and the sensing circuitry 10 is distributed between the receiver assembly 16 and the sensing controller 12; as will be explained in more detail below.

The sensing controller 12 is coupled to the transmitter assembly 14 and the receiver assembly 16 such that in operation the sensing controller provides an alternating voltage 18 to both the transmitter assembly 14 and the receiver assembly 16. The receiver assembly 16 is further separately coupled to the sensing controller 12 such that in operation the receiver assembly 16 provides a data signal 20 to the sensing controller 12.

Figure 3:
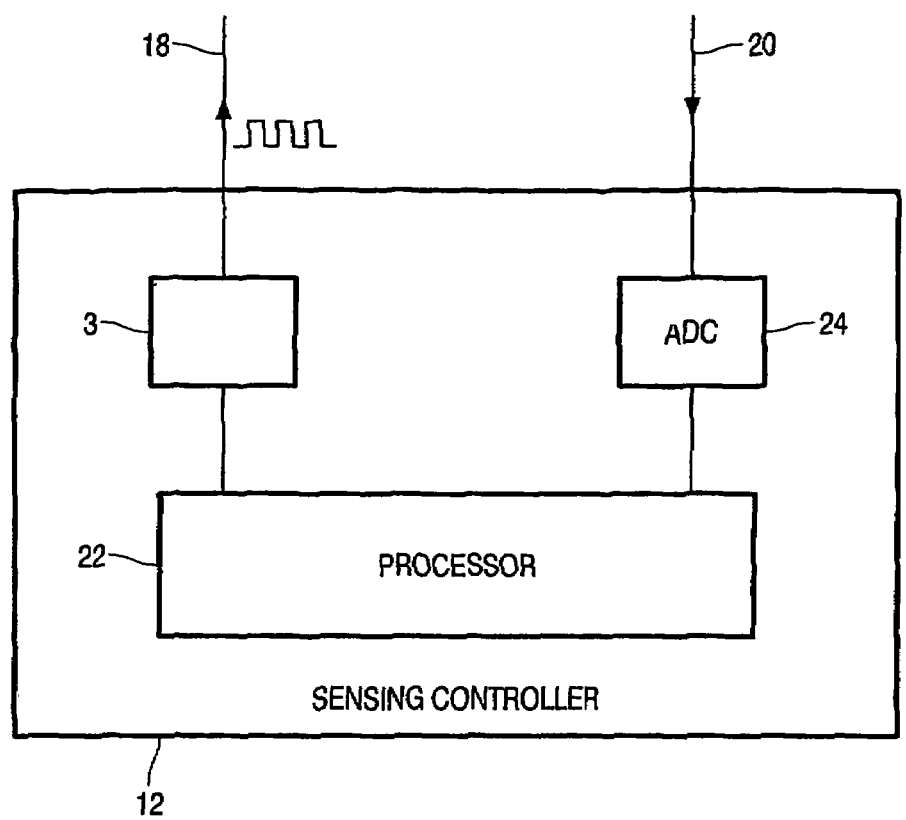
FIG. 3 is a block diagram showing details of a sensing controller of the electric field object sensing system of FIG. 1.

FIG. 3 is a block diagram showing further details of the sensing controller 12. The sensing controller 12 comprises an output in the form of the previously mentioned alternating voltage source 3. The sensing controller 12 also comprises an input in the form of an analogue to digital converter (ADC) 24. The sensing controller 12 also comprises a processor 22. The processor 22 is coupled to both the alternating voltage source 3 and the ADC 24.

In operation the above described parts of the sensing controller function as follows. The alternating voltage source 3 provides the alternating voltage 18 output to both the transmitter assembly 14 and the receiver assembly 16. The ADC 24 receives, and converts to digital form, the input data signal 20 received from the receiver assembly 16. The ADC 24 forwards the digital form of the received data to the processor 22 for higher level processing. The processor 22 performs general control processes controlling the alternating voltage source 3, the ADC 24, and any other components (not shown) that may be provided for other purposes. In addition, the processor 22 performs higher level processing on the digital data signal it receives from the ADC 24.

Figure 4:
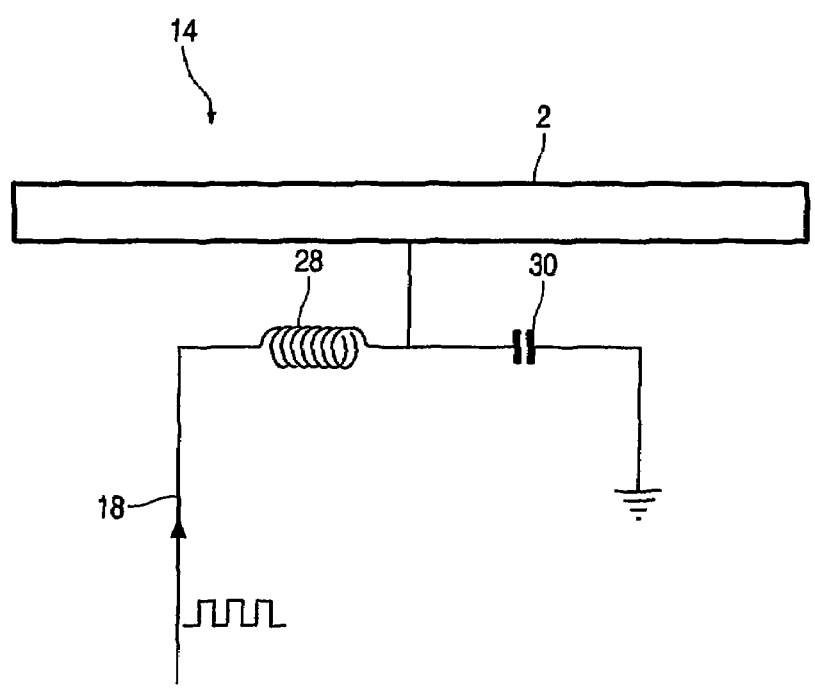
FIG. 4 is a schematic illustration showing details of a transmitter assembly of the electric field object sensing system of FIG. 1.

FIG. 4 is a schematic illustration showing further details of the transmitter assembly 14. The transmitter assembly 14 primarily comprises the previously mentioned transmitter electrode 2 arranged to be supplied with the alternating voltage 18. In this embodiment the transmitter assembly 14 further comprises a resonator formed from an inductor 28 and a resonance capacitor 30. The resonator is arranged such that the alternating voltage 18 is delivered to the transmitter electrode 2 via the resonator, thereby amplifying the alternating voltage provided to the transmitter electrode 2.

Figure 5:
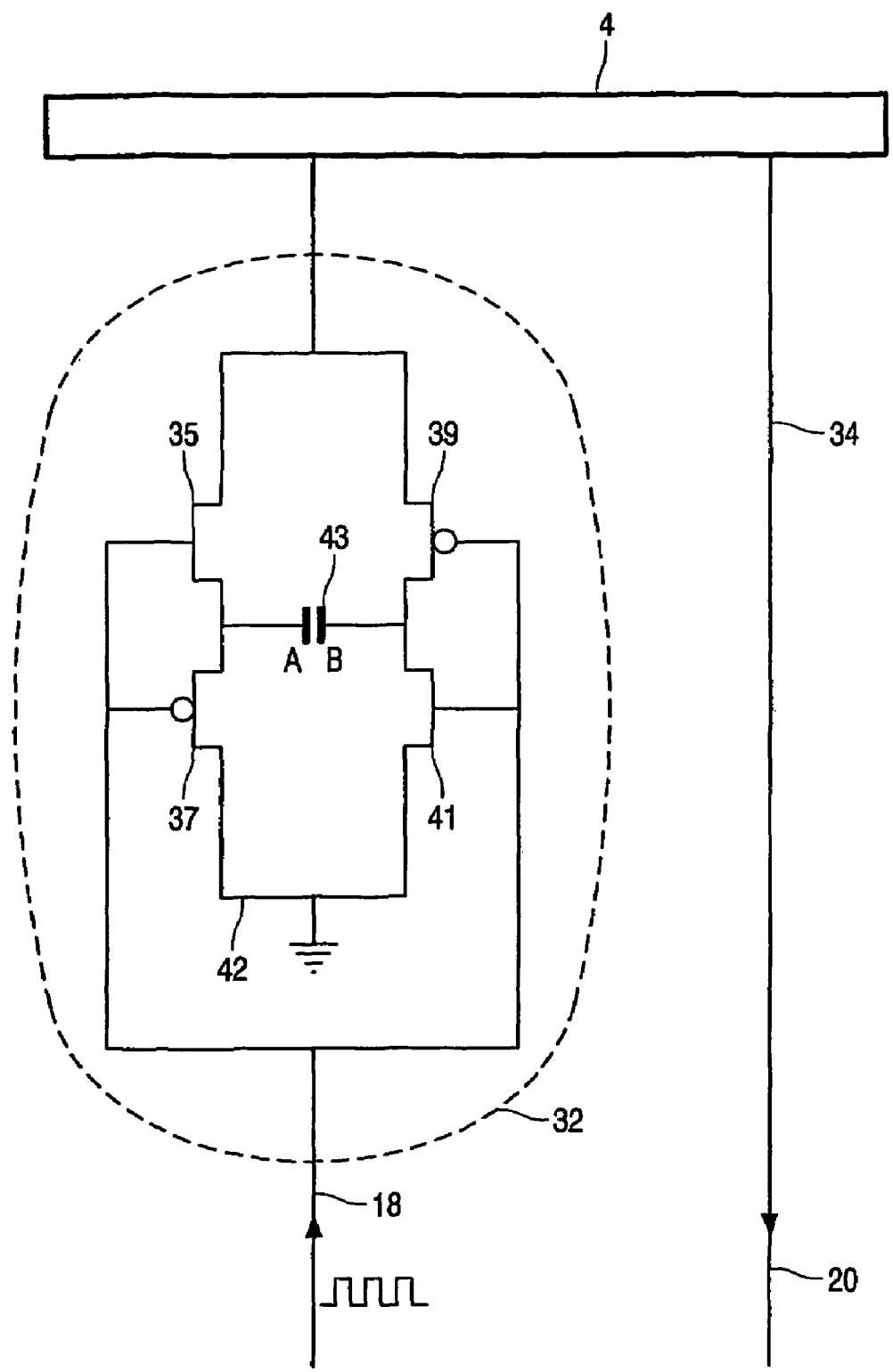
FIG. 5 is a schematic illustration showing details of a receiver assembly of the electric field object sensing system of FIG. 1.

FIG. 5 is a schematic illustration showing further details of the receiver assembly 16. The receiver assembly 16 comprises the receiver electrode 4 coupled to a switching circuit 32 and a direct output connection 34. The switching circuit 32 is further coupled to the alternating voltage source 3 of the sensing controller 12, such that in operation the alternating voltage 18 is fed to the receiver electrode 4 via the switching circuit 32. The direct output connection 34 is further coupled to the ADC 24 of the sensing controller 12, such that in operation the data signal 20 is delivered from the receiver electrode 4 to the ADC 24.

The switching circuit 32 will now be described in more detail. The switching circuit 32 comprises two n-type TFTs, hereinafter referred to as a first n-type TFT 35 and a second n-type TFT 41; two p-type TFTs, hereinafter referred to as a first p-type TFT 37 and a second p-type TFT 39; and a capacitor 43.

The circuit components are connected as follows. The gates of all four TFTs 35, 37, 39, 41 are connected to each other and to the incoming connection from the alternating voltage source 3. The TFTs 35,37,39,41 each have, in conventional fashion, two further source/drain terminals (hereinafter referred to as a first and a second terminal) in addition to the gate. In operation, one of the source/drain terminals functions as the source of the TFT and the other of the source/drain terminals functions as the drain of the TFT. The question of which source/drain terminal serves as the source and which serves as the drain at any particular moment is determined by the polarity of the applied voltage at that moment. The first terminal of the first n-type TFT 35 and the first terminal of the second p-type TFT 39 are connected to each other and to the receiver electrode 4. The second terminal of the first n-type TFT 35 and the first terminal of the first p-type TFT 37 are connected to each other and to one side (hereinafter referred to as side A) of the capacitor 43. The second terminal of the first p-type TFT 37 and the second terminal of the second n-type TFT 41 are connected to each other and to an earth connection 42. The second terminal of the second p-type TFT 39 and the first terminal of the second n-type TFT 41 are connected to each other and to the other side (hereinafter referred to as side B) of the capacitor 43.

Figure 6:
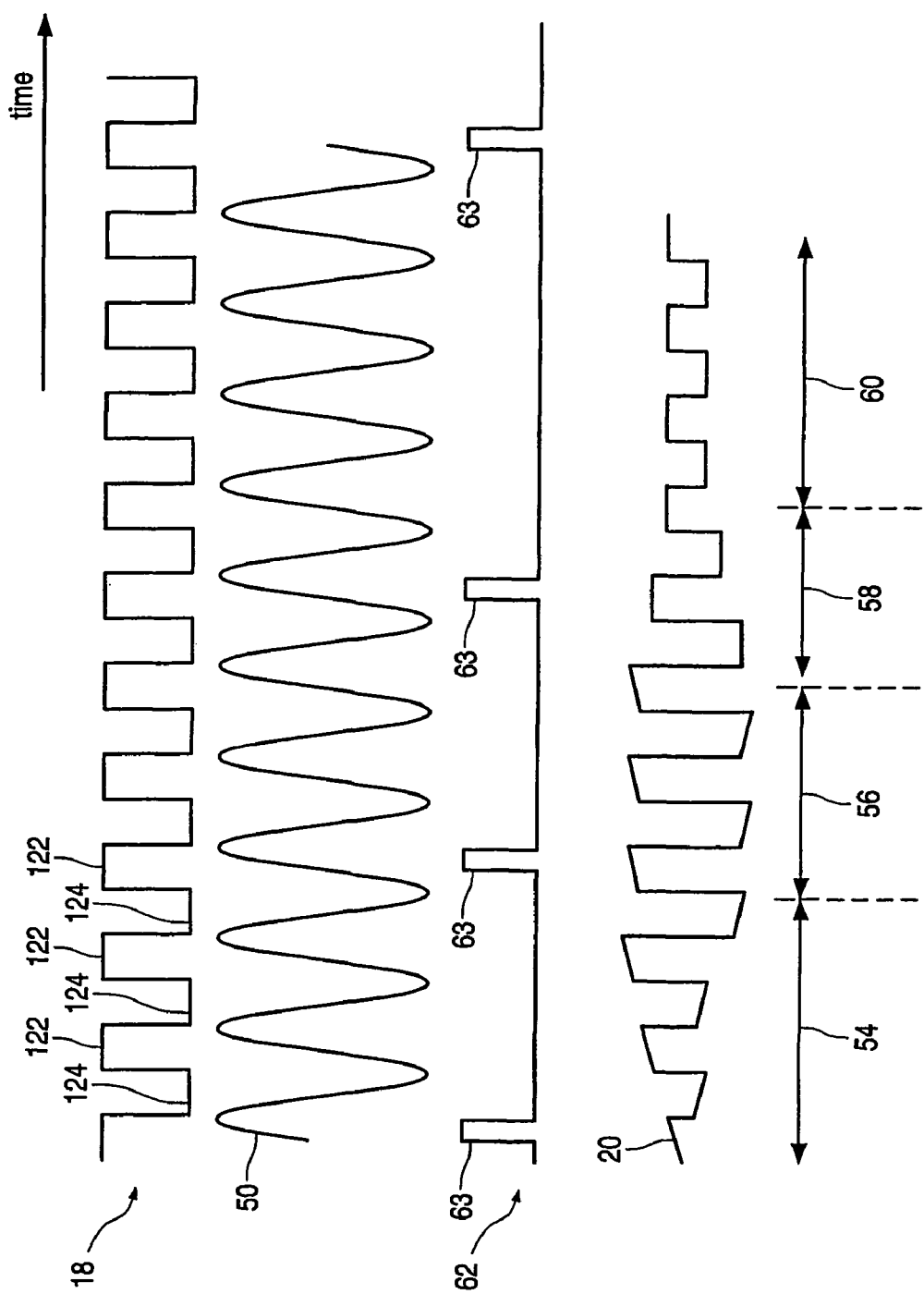
FIG. 6 illustrates qualitatively various waveforms and signals involved in operation of the electric field object sensing system of FIG. 1.
Figure 7A:
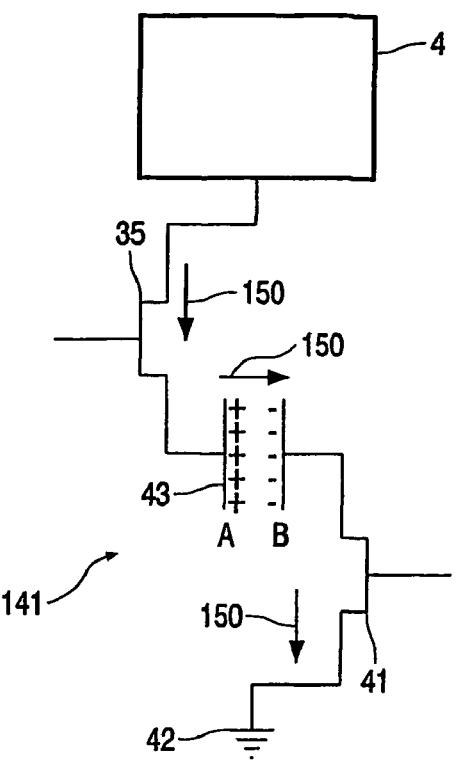
FIGS. 7a and 7b show respectively a first circuit part and a second circuit part that operate separately according to positive and negative parts of the cycle of an alternating voltage supply.
Figure 7B:
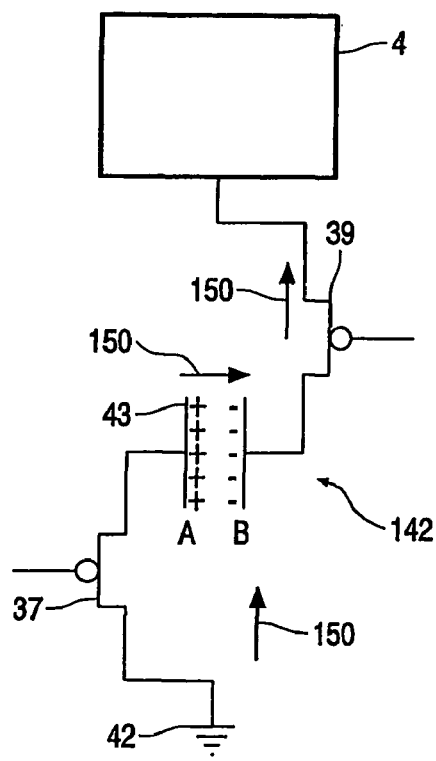

In summary, the switching circuit 32 operates by effectively operating as two separate circuit parts. The first circuit part comprises the first n-type TFT 35, the capacitor 43 and the second n-type TFT 41. The second circuit part comprises the first p-type TFT 37, the capacitor 43, and the second p-type TFT 39 (note the capacitor 43 is shared by both circuit parts). The two circuit parts are activated alternately in response to the positive and negative cycles of the alternating voltage 18 supplied by the alternating voltage source 3. Each of the two circuits accumulates charge (from the receiver electrode 33) at the capacitor 43. This charge is accumulated in the same charge sense at the capacitor for each of the two circuits. The operation of the above described electric field object sensing system 1 will now be described in more detail, with reference to FIGS. 6 and 7. FIG. 6 illustrates qualitatively various waveforms and signals involved in the operation of the system. FIGS. 7a and 7b show respectively the first circuit part and second circuit part that operate separately according to the positive and negative parts of the cycle of the alternating voltage 18.

FIG. 6 shows the alternating voltage 18, which in this embodiment is a bipolar square wave of +/−10V and frequency 100 kHz. Indicated in FIG. 6 by way of example are three consecutive positive parts 122 and three consecutive negative parts 124 of the cycle of the alternating voltage 18.

FIG. 6 further shows an alternating voltage of waveform 50, having the same phase as the alternating voltage 18, appearing on the transmitter electrode 2 as a result of the alternating voltage 18 having been modified by the resonator circuit.

Electric field lines (e.g. field lines 5, 6, 7 as described with reference to FIG. 1) are consequently produced from the transmitter electrode 2. In effect these field lines lead to the waveform 50 being capacitively coupled onto the receiver electrode 33, thereby generating a changing charge (rising and falling in phase with the alternating voltage 18) on that electrode. A current will attempt to flow from or to the receiver electrode 4 when connected in a circuit, in this case the switching circuit 32, due to the changing charge. Employing usual current sign notation convention, for the positive parts 122 of the cycle of the alternating voltage 18, positive parts of a corresponding cycle of a current flowing or attempting to flow through the switching circuit 32 are produced. Correspondingly, for the negative parts 124 of the cycle of the alternating voltage 18, negative parts of the corresponding cycle of the current flowing or attempting to flow through the switching circuit 32 are produced. Further details of these aspects are given in the previously mentioned WO-02/103621, the contents of which are contained herein by reference.

So far, the effects produced by the provision of the alternating voltage 18 to the transmitter electrode 2 have been described. The alternating voltage 18 has additionally been provided to the gates of the TFTs 35, 37, 39, 41 of the switching circuit 32. This has the effect that (i) during the positive parts 122 of the cycle of the alternating voltage 18 only the two n-type TFTs 35, 41 are is activated, such that the switching circuit 32 operates for the duration of the positive part 122 of the cycle of the alternating voltage 18 as if it consists only of a first circuit part 141, shown in FIG. 7a, comprising the first n-type TFT 35, the capacitor 43, and the second n-type TFT 41; and (ii) during the negative parts 124 of the cycle of the alternating voltage 18 only the two p-type TFTs 37, 39 are activated, such that the switching circuit 32 operates for the duration of the negative part 124 of the cycle of the alternating voltage 18 as if it consists only of a second circuit part 142, shown in FIG. 7b, comprising the first p-type TFT 37, the capacitor 43, and the second p-type TFT 39.

The operation over the duration of a single positive part 122 and a single negative part 124 of the cycle of the alternating voltage 18 will now be described. Assume we start with a positive part 122 of the cycle of the alternating voltage 18. This produces a corresponding positive part of the cycle of the current. Meanwhile, the n-type TFTs 35, 41 are activated effectively providing the first circuit part 141, as described above. Hence, a positive current flows through the first circuit part 141. The direction of the flow of positive current, shown by arrows 150 in FIG. 7a, is from the receiver electrode 4 to the earth connection 42. This involves the positive charge flowing from side A to side B of the capacitor 43, thus, charge is accumulated at the capacitor 43. Because the positive charge is flowing from side A to side B, the charge sense of this accumulated charge at the capacitor 43 is that of positive charge on side A and negative charge on side B.

Now consider when the phase of the alternating voltage 18 changes, i.e. the positive part 122 of the cycle of the alternating voltage 18 ends, and a negative part 124 of the cycle of the alternating voltage 18 takes place. This produces a corresponding negative part of the cycle of the current. Meanwhile, the p-type TFTs 37, 39 are activated, effectively providing the second circuit part 142, as described above. Hence, a negative current flows through the second circuit part 142. Because this is a negative part of the cycle, the direction of the flow of positive charge, shown also in FIG. 7b by arrows 150, is now from the earth connection 42 to the receiver electrode 4.

Although the direction of the flow of the positive charge is now, in terms of the earth connection 42 and the receiver electrode 4, opposite to that of the flow of the positive charge in the positive part 122 of the cycle of the alternating voltage 18 (compare the arrows 150 in FIG. 7b with FIG. 7a), nevertheless, because in the second circuit part 142 the capacitor 43 is between the two p-type TFTs 37, 39 whereas in the first circuit part 141 the capacitor 43 is between the two n-type TFTs, the positive charge again flows from side A to side B of the capacitor 43. Thus charge is accumulated at the capacitor 43. Because the positive charge is again flowing from side A to side B, the charge sense of this accumulated charge at the capacitor 43 is again that of positive charge on side A and negative charge on side B, i.e. the charge sense of the accumulated charge at the capacitor 43 during this negative part 124 of the cycle of the alternating voltage 18 is the same as it was during the positive part 122 of the cycle of the alternating voltage 18. This may be termed charge pump operation.

It is noted that the above described operation of the switching circuit is effectively the same as that of the same circuit in the overall processes disclosed by WO-02/103621 in terms of alternating activation of the two circuit parts 141 and 142. However, the operations leading to the charging that takes place at the capacitor, as well as what the charges produced at the capacitor represent are completely different. Roughly speaking, in WO-02/103621 the charge stored by the capacitor is a charge being built up afresh each time after the electrodes have been reset, and the rate of charge build up is representative of the capacitive current induced which is in effect measured as such as the current. In contrast, again roughly speaking, in this embodiment the charge stored by the capacitor is allowed to achieve a saturation balance, which provides a voltage reading, and this saturation balance then varies when an object is introduced (e.g. the electrodes are not repeatedly re-set to zero to enable detection to take place).

As a result of the charge pump operation, the voltage across the capacitor 43 increases as the capacitive coupling between the transmitter electrode 2 and the receiver electrode 4 increases. This voltage saturates when the charge accumulated on the capacitor 43 during each cycle is equal to the amount of charge lost on the receiver electrode 4. This is because, in effect, at each cycle the receiver electrode 4 itself has to be charged to the voltage across the capacitor 43. Roughly speaking, each time the effective part of the switching circuit 32 changes from the first circuit part 141 to the second circuit part 142 or vice-versa, there is charge sharing between the capacitor 43 and the parasitic capacitance experienced by the receiver electrode 4. In this context, the parasitic capacitance experienced by the receiver electrode 4 is effectively all the capacitances existing or occurring between the receiver electrode 4 and anything other than the transmitter electrode 2.

The relative magnitude of the parasitic capacitance of the receiver electrode 4 compared to the capacitance of the capacitor 43 determines how much charge is lost at each cycle. Hence the saturation voltage across the capacitor 43 is determined by the ratio of, on the one hand, the capacitance between the receiver electrode 4 and the transmitter electrode 2, and on the other hand, the parasitic capacitance experienced by the receiver electrode 4.

When a grounded or relatively grounded object, here the finger 8, is introduced in the vicinity of the transmitter electrode 2 and receiver electrode 4, the capacitance between the receiver electrode 4 and the transmitter electrode 2 decreases due to the object interrupting the field lines. This may alternatively or additionally be understood in terms of the grounded or relatively grounded object 8 shielding the receiver electrode 4 from the transmitter electrode 2. (Also, the parasitic capacitance experienced by the receiver electrode 4 increases due to capacitance being introduced between the object 8 and the receiver electrode 4, however this effect will usually be negligible compared to the effect on the capacitance between the transmitter electrode 2 and the receiver electrode 4.) Thus the saturation voltage decreases. This is used to measure the presence of the object 8 as will be now be described in more detail with further reference to FIG. 6.

FIG. 6 further shows the voltage that accumulates on the receiver electrode 4 in correspondence to the application of the alternating voltage 18, as a result of the effects described above. As will be explained in more detail below, this accumulated voltage forms the data signal 20 output by/from the receiver electrode (or connections thereto) described earlier with reference to FIGS. 2, 3 and 5, and therefore is also indicated in FIG. 6 by reference numeral 20.

The accumulated voltage 20 changes polarity at each half cycle because of the above described switching of the switching circuit 32 between the first circuit part 141 and the second circuit part 142.

In FIG. 6, the plot of the accumulated voltage 20 is divided into four different time sections 54, 56, 58, 60 schematically illustrating (not to scale in terms of either magnitude or timescale) different situations in the operation of the electric field object sensing system 1.

If we assume that the left hand end of FIG. 6 schematically shows the alternating voltage 18 for when the electric field system 1 is started or re-started, then the corresponding first section 54 of the accumulated voltage 20 schematically shows how during this time the accumulated voltage 20 on the receiver electrode 4 increases with time (or, strictly speaking, the magnitude of the accumulated voltage 20 on the receiver electrode 4 increases with time), i.e. there may be said to be a rising signal.

This increase then saturates when a balance between the charge gained and lost at each cycle is reached, as described above. When saturation has been reached, the (magnitude of the) accumulated voltage 20 on the receiver electrode 4 remains constant with time, as represented schematically in FIG. 6 by the second section 56 of the accumulated voltage 20, i.e. there may be said to be a saturated signal.

When the object 8 is placed in the vicinity of the transmitter electrode 2 and the receiver electrode 4, the balance providing the saturation is disturbed due to the capacitance between the transmitter electrode 2 and the receiver electrode 4 decreasing, as described above. In FIG. 6, a third section 58 of the accumulated voltage 20 schematically shows how the (magnitude of the) accumulated voltage 20 on the receiver electrode 4 decreases with time, i.e. there may be said to be a decaying signal.

This decrease then saturates when a new balance between the charge is gained and lost at each cycle is reached, this time at a lower voltage (magnitude). When saturation has been reached, the (magnitude of the) accumulated voltage 20 on the receiver electrode 4 remains constant at the lower level with time, as represented schematically in FIG. 6 by the fourth section 60 of the accumulated voltage 20, i.e. there may be said to be a lower level saturated signal representing presence of the object 8.

By measuring a saturated signal achieved over several cycles (say 100 cycles) a bigger measurement quantity is achieved than just over one cycle. Also, this provides a reading that has averaged out contributions from other noise sources. I.e. the circuit has a useful (band pass) filtering action.

The accumulated voltage 20 is fed directly into the ADC 24 of the sensing controller 12. The ADC 24, under the control of the processor 12, is arranged or controlled to read-out the level of the accumulated voltage 20 signal at intervals. In this example, the ADC 24 is arranged or controlled to read-out the level of the accumulated voltage 20 signal during the positive part 122 of the cycle of the alternating voltage 18, thus ensuring the voltage is in the correct range of the ADC 24. FIG. 6 further shows schematically a digital output signal 62 provided by the ADC 24 in response to the accumulated voltage 20. For simplicity, in this example only one respective digital output measurement point 63 is shown for each respective section of the sections 54, 56, 58, 60 of the accumulated voltage 20, although in practice there may be more than one for each section.

Figure 8:
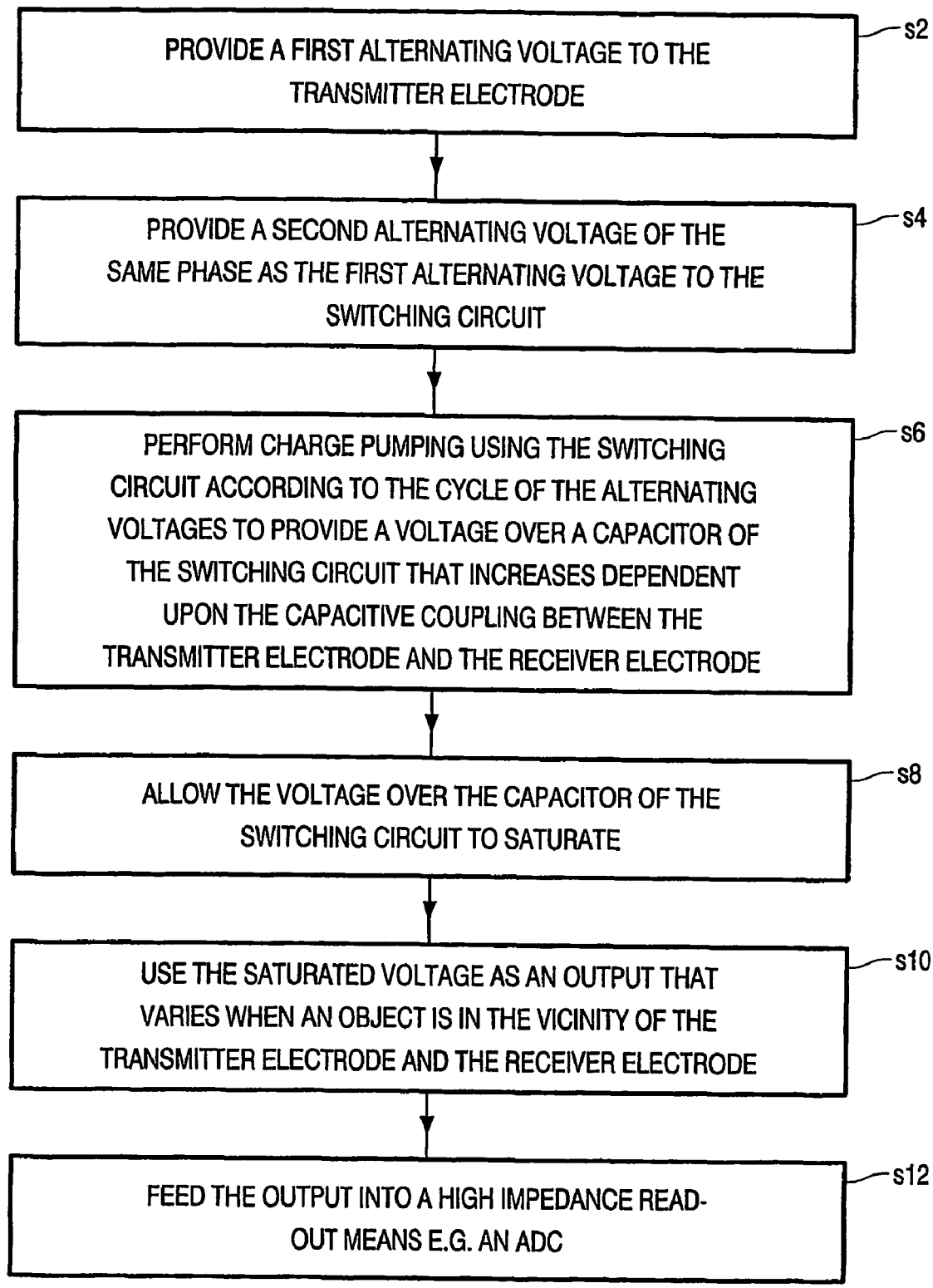
FIG. 8 is a flowchart showing a summary of the operation of the electric field object sensing system of FIG. 1.

FIG. 8 is a flowchart showing a summary of the above described operation of the electric field object sensing system 1 in terms of process steps (note that in order to allow the convenience of a flowchart representation, various steps that in fact occur simultaneously are indicated separately in FIG. 8).

Referring to FIG. 8, at step s2 a first alternating voltage (the voltage of waveform 50 being the alternating voltage 18 as modified by the resonator formed by the inductor 28 and the capacitor 30) is provided to the transmitter electrode 2.

At step s4, a second alternating voltage (the alternating voltage 18) of the same phase as the first alternating voltage is provided to the switching circuit 32 which is coupled to the receiver electrode 4.

At step s6, charge pumping is performed using the switching circuit 32, according to the cycle of the alternating voltages, to provide a voltage over a capacitor 43 of the switching circuit 32 that increases dependent upon the capacitive coupling between the transmitter electrode 2 and the receiver electrode 4.

At step s8, the voltage over the capacitor 43 of the switching circuit 32 is allowed to saturate.

At step s10, the saturated voltage is used as an output 20 that varies when an object 8 is in the vicinity of the transmitter electrode 2 and the receiver electrode 4.

At step s12, the output 20 is fed into a high impedance read-out means comprising an analogue to digital converter 24.

The respective magnitudes of the different digital output measurement points 63 provides a simple form of data that may readily be processed, e.g. in the form of higher level processing by the processor 22, in a more straightforward way than is required for data output from conventional processes. Such higher level processing will be as required according to the particular circumstances (end-use) the object sensing system 1 is to be employed in. Such higher level processing may employ inputs from more than one receiver electrode, and the inputs from the one or more receiver electrodes may result from electric fields provided by more than one transmitter electrode. The use of plural transmitter electrodes and/or receiver electrodes, and processing of the various signals involved to provide required positional data is well known in the art and will not be described in detail here. However, it is to be noted that the novel data outputs of the present invention (i.e. the accumulated voltage signal 20 and/or the digital output signal 62) allow processing to be implemented by relatively simple electronics, allowing simpler integration into electronic products.

Figure 9:
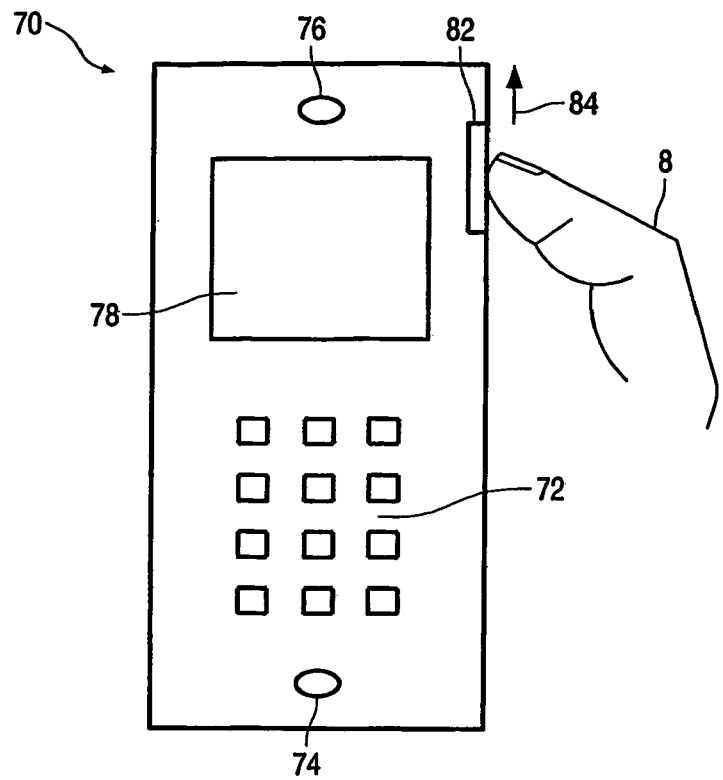
FIG. 9 shows a mobile telephone.

One such example will now be described with reference to FIG. 9. FIG. 9 shows a mobile telephone 70. The mobile telephone 70 comprises a is keyboard 72, a microphone 74, a loudspeaker 76 and a display 78.

The mobile telephone 70 further comprises an electric field object sensing system, of which an electric field sensing electrode arrangement 82 is shown schematically (not to scale) in FIG. 9. In this embodiment the electrode arrangement 82 comprises one receiver electrode and two transmitter electrodes, one placed above the receiver electrode and one placed below the receiver electrode. By placing a finger 8 in the vicinity of the electrode arrangement 82 and moving the finger 8 in a direction 84 up the telephone, output signals (as described earlier above, but here separate ones one for each of the transmitters by multiplexing separate inputs by any appropriate method) are provided that may be processed to use this movement as an input for a scrolling command to the display 78 of the mobile telephone 70. Thus the object sensing system provides a user interface input for the mobile telephone. In this example, the electronic components of the electric field object sensing system are implemented in digital CMOS and incorporated into a display driver chip set of the mobile telephone 70 used to drive the display 78.

In the above embodiment, the particular switching circuit 32 is used to carry out the described charge pump operation. The charge pump operation is used in the above embodiment to enable the novel process of saturating the capacitor 43 at a level dependent on the ratio of the capacitance between the transmitter electrode 2 and the receiver electrode 4 and the parasitic capacitance experienced by the receiver electrode (this ratio changing when the object is placed between or in the vicinity of the transmitter electrode 2 and the receiver electrode 4). However, in other embodiments, any suitable charge pumping means may be employed instead of the particular switching circuit 32.

Figure 10:
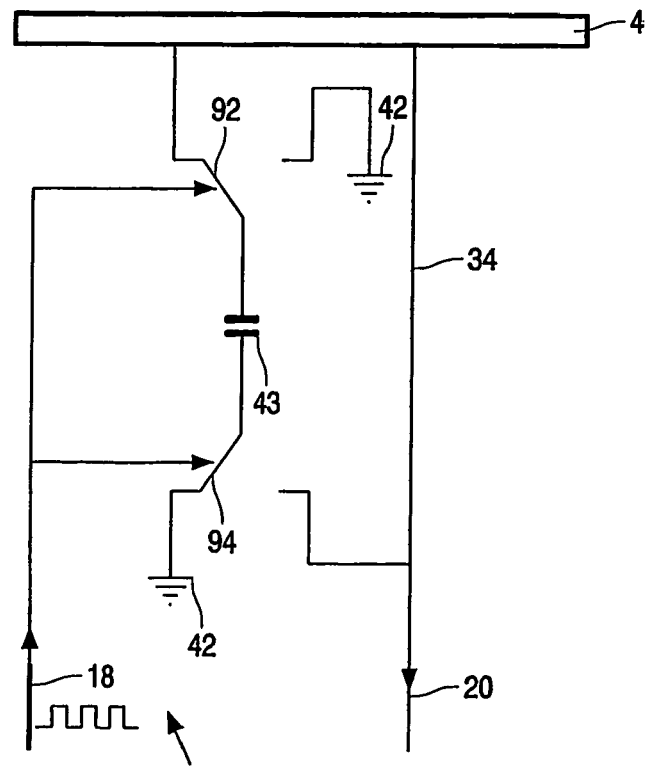
FIG. 10 is a schematic illustration of a switching arrangement.

For example, the switching circuit 32 may be considered to correspond in general to a switching arrangement of the form shown in FIG. 10, in which the same reference numerals are used to identify like parts with the arrangement of FIG. 5. In the switching arrangement shown in FIG. 10, a first switch 92 and a second switch 94 are arranged to switch the alternating voltage 18 at respective sides of the capacitor 43 to either the receiver electrode 4 or the earth connection 42. The switches operate in tandem in response to the polarity of the alternating voltage 18 such that when one side of the capacitor is switched to the receiver electrode the other side of the capacitor is switched to the receiver electrode, and vice-versa. This corresponds to the operation of the switching circuit 32 as shown in FIG. 5.

Thus, in other embodiments, the switches 92 and 94 may be implemented in any suitable way. For example, one alternative way to implement these switches, in conventional CMOS technology, is using so-called transmission gates as implemented for example in an item identified as LTC1043CN available from Linear Technology Corporation (trade mark).

In the above embodiment, the alternating voltage 18 is a bipolar square wave of +/−10V and frequency 100 kHz. In other embodiments other alternating waveforms and/or voltage level and/or frequency may be employed. For example, power may be saved by using a lower frequency such as 1 kHz. This may however introduce a loss of response speed or signal level, which may be alleviated by varying the frequency in an adaptive manner. If this was done, the resonator circuit, if employed, would preferably be adapted accordingly to function at different frequencies.

Any of the various details of the various circuits employed in the above embodiment may be varied, or replaced by other types of circuit, as required in order to provide or contribute to the charge saturating and balancing effects described. This includes the various read-out stages and later processing stages.

For example, an operational amplifier (OPAMP) stage may be inserted between the receiver electrode and the processing electronics (e.g. in the embodiment described above, between the receiver electrode and the ADC input or between the ADC output and the processor).

As another example, in order to make the circuitry simpler, the LC resonator in the transmitter assembly may be replaced by a resistor-capacitor (RC) filter, or indeed may be omitted with no filter used. In the latter case, the alternating voltage 18 is directly fed to the transmitter electrode, whereas in cases where the alternating voltage 18 is fed to the transmitter electrode 2 via a filter or resonator, the alternating voltage or waveform at the transmitter electrode is a modified form of the alternating voltage, the modified form nevertheless having the same phase as the alternating voltage 18.

As another example, the ADC may be replaced by a comparator, although this would tend to provide lower resolution. More generally, the ADC could be replaced by any other suitable "read-out" means. Preferably, any such read-out means have high impedance input, as is the case with the ADC or a comparator. Indeed, the opportunity to use a simple and relatively insensitive (to errors, interference, etc) high impedance input device as the read-out means represents an advantage of the present invention, compared to prior art methods which measure currents in a sensitive fashion not favouring efficient use of high impedance read-out means. However, it should be noted that the present invention is not restricted as such to high impedance read-out means, although if the read-out means are of lower impedance than the parasitic capacitance experienced by the receiver electrode then the parasitic capacitance will tend to determine the voltage balance.

As another example, the processor 22 (or equivalent processing functions in other embodiments) may be implemented in the form of a microprocessor or, due to the simple way in which the outputs data signal may be provided, in the form of relatively simple digital hardware, for example a gate array.

One advantage of the present invention is that part or all of the circuitry may be implemented using CMOS technology, as in the above embodiment. However, it is to be appreciated that the present invention is not limited to when it is implemented as CMOS, and in other embodiments some or all of the circuitry may be implemented using any other suitable technologies. In the above embodiment the electric field object sensing system was incorporated in a mobile telephone. However, the present invention may be implemented in any number of end-use applications or devices, for example display driver chips, microprocessors, audio drivers and other chipsets, particularly when implemented using CMOS technology, such that the object sensing functionality offered by the electric field object sensing system may be added at relatively low additional costs to products such as radios, televisions, remote controls, and so on in addition to the mobile telephone embodiment described above. If a larger number of transmitter electrodes and receiver electrodes are multiplexed, an array of transmitter/receiver pairs may be provided thereby allowing use as a three dimensional touchless interface.

The invention claimed is:

1. An electric field object sensing system, comprising:
   a transmitter electrode;
   a receiver electrode;
   a charge pumping circuit coupled to the receiver electrode;
   an alternating voltage source coupled to the transmitter electrode and the charge pumping circuit; and
   an output connection coupled to the receiver electrode;
   wherein the charge pumping circuit is arranged to perform charge pumping according to the common cycle of alternating voltages applied from the alternating voltage source to the transmitter electrode and the charge pumping circuit; and the charge pumping circuit comprises a capacitor arranged such that a voltage developed across the capacitor saturates at a level dependent upon a capacitance between the transmitter electrode and the receiver electrode.

2. A system according to claim 1, further comprising a high impedance read-out means coupled to the output connection.

3. A system according to claim 2, wherein the high impedance read-out means is an analogue to digital converter.

4. A system according to claim 2, wherein the high impedance read-out means is a comparator.

5. A system according to claim 1, wherein the alternating voltage source is coupled to the transmitter electrode via a resonant circuit.

6. A system according to claim 1, implemented at least in part in CMOS.

7. A control circuit for an electronic product comprising a system according to claim 1 integrated in the control circuit.

8. A method of providing an output from a receiver electrode of an electric field object sensing system, the method comprising:
   providing a first alternating voltage to a transmitter electrode;
   providing a second alternating voltage of the same phase as the first alternating voltage to a switching circuit coupled to the receiver electrode;
   performing charge pumping, using the switching circuit, according to the cycle of the alternating voltages, to provide a voltage over a capacitor of the switching circuit that increases dependent upon a capacitance coupling between the transmitter electrode and the receiver electrode;
   allowing the voltage over the capacitor of the switching circuit to saturate; and
   using the saturated voltage as an output that varies when an object is in the vicinity of the transmitter electrode and the receiver electrode.

9. A method according to claim 8, further comprising feeding the output into a high impedance read-out means.

10. A method according to claim 9, wherein the high impedance read-out means is an analogue to digital converter.

11. A method according to claim 9, wherein the high impedance read-out means is a comparator.

12. A method according to claim 8, wherein the first alternating voltage is the same as the second alternating voltage.

13. A method according to claim 8, wherein the first alternating voltage is provided by feeding the second alternating voltage to the transmitter electrode via a resonant filter.

\* \* \* \* \*